United States Patent
Mahler et al.

(10) Patent No.: US 8,330,252 B2
(45) Date of Patent: Dec. 11, 2012

(54) INTEGRATED CIRCUIT DEVICE AND METHOD FOR THE PRODUCTION THEREOF

(75) Inventors: Joachim Mahler, Regensburg (DE);
Reimund Engl, Regensburg (DE);
Thomas Behrens, Wenzenbach (DE);
Wolfgang Kuebler, Munich (DE);
Rainald Sander, Munich (DE)

(73) Assignee: Infineon Technologies AG, Neubiberg (DE)

( * ) Notice: Subject to any disclaimer, the term of this patent is extended or adjusted under 35 U.S.C. 154(b) by 537 days.

(21) Appl. No.: 11/869,845

(22) Filed: Oct. 10, 2007

(65) Prior Publication Data

US 2008/0246137 A1 Oct. 9, 2008

(30) Foreign Application Priority Data

Oct. 19, 2006 (DE) .......................... 10 2006 049 949

(51) Int. Cl.
*H01L 29/66* (2006.01)

(52) U.S. Cl. ........ 257/578; 257/566; 257/567; 257/573; 257/584; 257/723; 257/724; 257/725

(58) Field of Classification Search .................. 257/566, 257/567, 568, 573, 578, 584, 723, 724, 725
See application file for complete search history.

(56) References Cited

U.S. PATENT DOCUMENTS

| | | | | |
|---|---|---|---|---|
| 5,739,582 | A * | 4/1998 | ElHatem et al. | 257/676 |
| 6,291,880 | B1 * | 9/2001 | Ogawa et al. | 257/723 |
| 6,777,800 | B2 * | 8/2004 | Madrid et al. | 257/690 |
| 2003/0102489 | A1 * | 6/2003 | Nam et al. | 257/177 |
| 2006/0076660 | A1 * | 4/2006 | Boschlin et al. | 257/678 |
| 2006/0118815 | A1 * | 6/2006 | Otremba et al. | 257/177 |
| 2007/0007344 | A1 * | 1/2007 | Inoue et al. | 235/435 |
| 2007/0013059 | A1 | 1/2007 | Otremba | |
| 2007/0216011 | A1 | 9/2007 | Otremba et al. | |

FOREIGN PATENT DOCUMENTS

| | | |
|---|---|---|
| DE | 19716674 | 8/1998 |
| DE | 102004035746 | 2/2006 |
| EP | 0696818 | 2/1996 |
| KR | 2085986 | 11/2002 |
| WO | 2006/012110 A2 | 2/2006 |
| WO | 2006012110 | 2/2006 |

OTHER PUBLICATIONS

Chuang, Tung-Han et al. "Intermetallic Compounds Formed During Diffusion Soldering of Au/Cu/Al2O3 and Cu/Ti/Si with Sn/In Interlayer," Journal of Electronic Materials, vol. 35, No. 7, Jul. 2006.*

* cited by examiner

*Primary Examiner* — Jae Lee
(74) *Attorney, Agent, or Firm* — Dicke, Billig & Czaja, PLLC

(57) ABSTRACT

An integrated circuit device includes a semiconductor chip and a control chip at different supply potentials. A lead chip island includes an electrically conductive partial region and an insulation layer. The semiconductor chip is arranged on the electrically conductive partial region of the lead chip island and the control chip is cohesively fixed on the insulation layer.

20 Claims, 2 Drawing Sheets

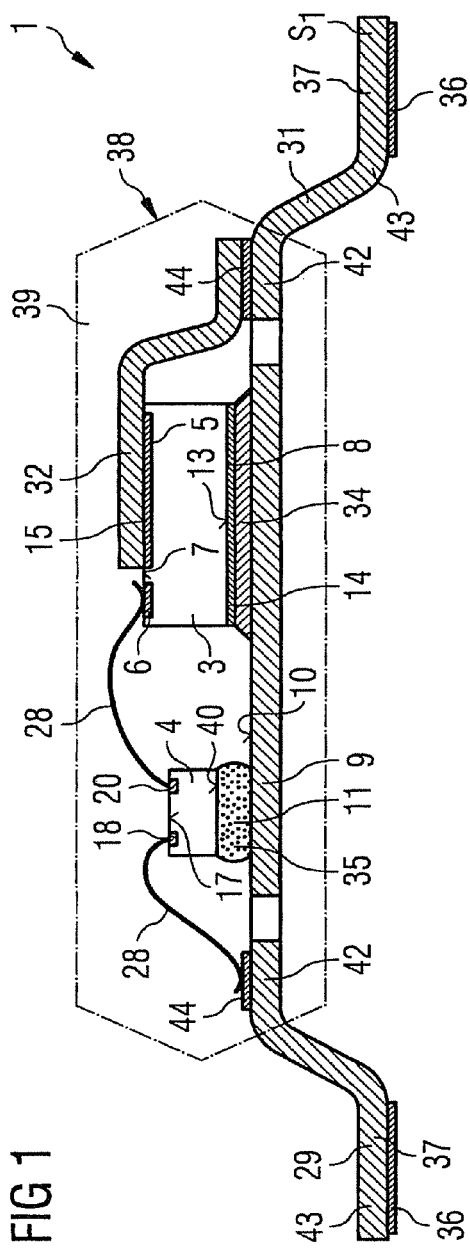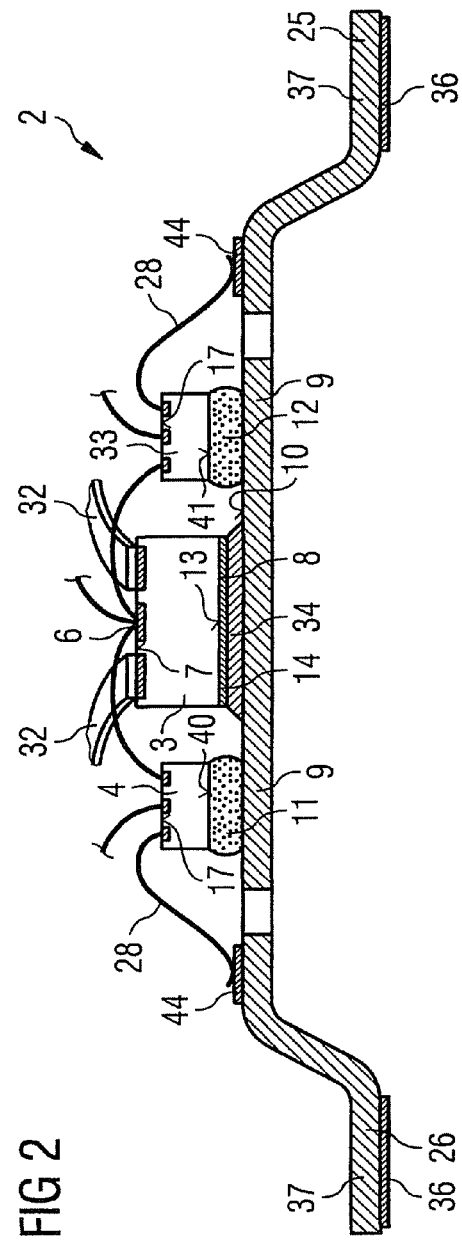

INTEGRATED CIRCUIT DEVICE AND METHOD FOR THE PRODUCTION THEREOF

CROSS-REFERENCE TO RELATED APPLICATIONS

This Utility Patent Application claims priority to German Application DE 10 2006 049 949.2, filed Oct. 19, 2006, which is incorporated herein by reference.

BACKGROUND

Aspects of the invention relate to a semiconductor module with semiconductor chips at different supply potentials, and to a method for the production thereof. One of the semiconductor chips has electrodes on its top side and a rear side electrode. Furthermore, the semiconductor component has a control chip, wherein the electrodes of the semiconductor chip have a larger area than the signal and supply electrodes on the top side of the control chip.

Large area or larger area is understood in this context to mean that power supply electrodes or power output electrodes of the semiconductor chip cover virtually an entire side of the semiconductor chip and are provided for a high, for example vertical, current-carrying. By contrast, small-area control electrodes, which transmit for example signals for controlling the power semiconductor chip or for clocking to a circuit node provided in the semiconductor module, take up only a fraction of a side of a semiconductor chip. In this case, it is characteristic of power semiconductor chips of the MOSFET type or of the IGBT type that a power output electrode and a control electrode are arranged on a common top side and a power supply electrode is arranged on a rear side as rear side electrode of the power semiconductor chip.

For driving the semiconductor chip, for example, in an on-board electrical supply system, integrated circuits are used as gate driver. Such a control chip with an integrated circuit, which chip requires a different supply potential relative to the semiconductor chip, can be fixed and wired as a stacked control chip on the top side of a power semiconductor chip. For this purpose, the control chip can be adhesively bonded onto the top side of the power semiconductor chip by a non-conductive medium. Such a "chip-on-chip construction" has the following disadvantages:

1. the areal extent of the control chip is limited to the areal extent of the top side of the power semiconductor chip;
2. the design of the top side of the power semiconductor chip must be adapted for the stacked control chip;
3. there is the risk of damage to the power semiconductor chip in the region of the adhesive joint;
4. there is the risk of impairing the bonding areas of the electrodes on the top side of the power semiconductor chip due to the electrically insulating adhesive;
5. the height of the semiconductor chip stack must be considerably smaller than the maximum thickness of the plastic housing composition above the semiconductor chip island.

The document DE 197 16 674 A1 provides, as semiconductor module, a semiconductor device having at least two semiconductor chips arranged on semiconductor chip islands separate from one another in each case, such that they can be at different potentials. This solution has the disadvantage that, for the application of different potentials, no standardized leadframe with a single central semiconductor chip island can be used and expensive special fabrications have to be provided for leadframes. Such semiconductor modules have such unfavourable external contact arrangements or "footprints" that the redistribution wiring outlay by virtue of corresponding conductor track routing on a superordinate circuit board is considerable and requires board area, which is disadvantageous for compact applications for current and voltage supply in on-board electrical supply systems and/or in mobile radio devices with AC/DC and/or DC/DC converters.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a schematic cross section through a semiconductor module of a first embodiment of the invention;

FIG. 2 illustrates a schematic cross section through a semiconductor module of a second embodiment of the invention;

DETAILED DESCRIPTION

Figure 3:
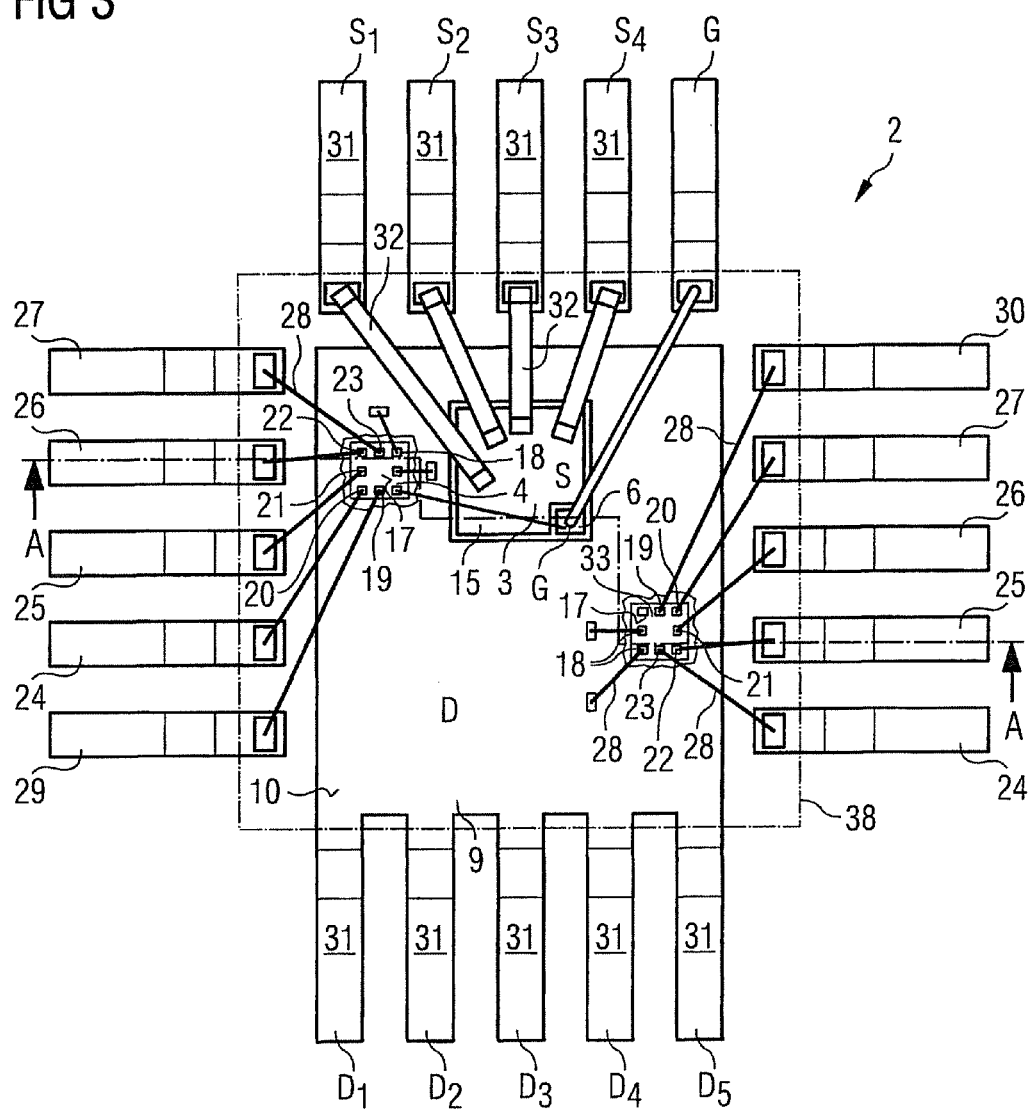
FIG. 3 illustrates a schematic plan view of the semiconductor module in accordance with FIG. 2.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In accordance with aspects of the present invention, a semiconductor module with semiconductor chips at different supply potentials and a method for the production thereof is disclosed herein. In this case, the semiconductor module has at least one semiconductor chip having electrodes on its top side and having a rear side electrode. Furthermore, the semiconductor module has at least one control chip. The semiconductor chip and the control chip are at different supply potentials and are arranged on a common lead chip island. The lead chip island has an electrically conductive partial region and an insulation layer. The semiconductor chip is arranged on the electrically conductive partial region of the lead chip island, while the control chip is cohesively fixed on the insulation layer.

One advantage of this semiconductor module is that the control chip with its integrated circuit is fixed by an electrically insulating medium on the same semiconductor chip island as the semiconductor chip, such that electrical breakdowns into the control chip do not occur even at applied voltages of far greater than 100 volts. This solution affords the advantage over "chip-on-chip constructions" that it is also possible to use housings whose plastic housing composition thickness above the power semiconductor chip is not large enough to completely encapsulate a control chip applied thereon. Furthermore, in the construction according to the invention, the control chip does not exert any mechanical stress on the semiconductor chip. Moreover, the arrangement of the contact areas of the electrodes is less restrictive for the semiconductor chip since it is not necessary to omit an adhesive bonding area for a control chip on the top side of the semiconductor, as is necessary in the case of semiconductor modules having stacked semiconductor chips.

In comparison with housings with specially stamped-out separate semiconductor chip islands on the leadframe for the control chip and for the semiconductor chip, there is the advantage that a special leadframe is not required in the case of the construction according to the invention, rather standard leadframes of the respective housing type can be used. What is thus achieved with the present invention is that a plurality of semiconductor chips with one or more logic devices can be arranged in a manner electrically isolated from one another on the same chip island. Consequently, it is also possible for one or more power semiconductor chips with a vertical current flow to be applied in an electrically conductive manner. The electrical insulation strength of the insulation layer composed of a connecting medium is chosen to be high enough so that there is a dielectric strength which is higher than the reverse voltage of the semiconductor chip or of the power semiconductor chips.

The semiconductor chip has on its rear side a large-area power supply electrode for applying a supply potential and on its top side a large-area power output electrode for translating an output current to power outputs of the semiconductor module and also a small-area control electrode. If a signal is applied to the control electrode, the power semiconductor chip turns on and a vertical forward current flows from the power supply electrode or the rear side electrode via the large-area power output electrode on the top side of the semiconductor chip to the power outputs of the semiconductor module in the form of leads. For this purpose, suitable power leads have a correspondingly large cross section adapted to the current loading.

The control chip, which is monolithically separated from the semiconductor chip, has on its top side both supply electrodes and input signal and/or control signal electrodes and is operatively connected to the control electrode of the semiconductor chip. For this purpose, the control chip can have an integrated gate driver. The input signal and/or control signal electrodes of the control chip are electrically connected via connecting elements to signal leads of the semiconductor module, wherein the signal leads have a smaller cross section than the power leads connected to the power electrodes of the semiconductor chip.

While the semiconductor chip is connected to a supply potential via its rear side electrode and via the chip island, the semiconductor module in a further embodiment of the invention has additional supply leads, which are electrically connected via corresponding connecting elements to the supply electrodes on the top side of the control chip.

Since the semiconductor chip has a power electrode on its top side, a high-current connecting element is required, which electrically connects the power electrode on the top side of the semiconductor chip to a corresponding power lead of the semiconductor module. Such a high-current connecting element can be realized by a connecting link in the form of a clip or by a plurality of bonding tapes or by a plurality of correspondingly thick aluminium bonding wires. By contrast, thinner bonding wires or bonding tapes are used as connecting elements for signal, control and supply electrodes and of the semiconductor chips among one another or to corresponding leads.

The chip island, which receives both the semiconductor chip and the control chip arranged on an insulation layer, is produced from a copper alloy to which the rear side electrode of the semiconductor chip is electrically connected. Moreover, the chip island can additionally be provided with one or more power leads which connect the chip island to the leadframe during the fabrication process and hold it in position and form power connections with external contact areas of the semiconductor module.

In a further embodiment of the invention, the semiconductor module has a supply lead for an earth potential, on which a MOSFET is arranged by its drain electrode or an IGBT is arranged by its collector electrode. The direct electrical contact between the drain electrode or the collector electrode and the supply lead of the semiconductor module ensures that a low-impedance connection to the external contact areas of the semiconductor module is produced. Moreover, provision is made for arranging a plurality of power semiconductor chips of the MOSFET type and/or of the IGBT type on the same semiconductor chip island. Further signal-processing semiconductor chips equipped with small-area electrodes can also be provided on the same chip island.

A diffusion solder layer is arranged between the semiconductor chip and the chip island. The diffusion solder material of the diffusion solder layer enables the power supply electrodes of the power semiconductor chips to be applied to the supply leads at a diffusion solder temperature under a predetermined contact pressure. Intermetallic phases having a higher melting point than the diffusion soldering temperature arise in this case. The diffusion soldering temperature is between 180° C. and 450° C. Consequently, the power semiconductor chips are then fixed stably on the supply leads also for the subsequent process temperatures. A material from the group AuSn, AgSn, CuSn or AgIn is used as diffusion solder material. In this case, the diffusion solder layer within the semiconductor module connects at least one large-area power supply electrode of a power semiconductor chip electrically and mechanically to a supply lead.

A further advantage is that the semiconductor chip, once it has been fixed by a diffusion solder layer, is not impaired during the curing temperatures for applying curable adhesive materials and substances, such as epoxy resin, acrylic resin, silicone resin, polyimide, high-performance thermoplastics or mixtures thereof, for the control chip that is additionally to be arranged on the chip island. A plastic film composed of epoxy resin, acrylic resin, silicone resin, polyimide, high-performance thermoplastics or mixtures thereof can also be arranged as insulation layer or insulating adhesive layer between the chip island and the control chip. Plastic films of this type have the advantage that they can be delimited in terms of their areal extent exactly to the region which is required by the control chip on the common semiconductor chip island.

The insulating substances of the adhesive layer can be unfilled or be filled with insulating particles from the group $SiO_2$, BN, $Al_2O_3$, AlN, diamond or PTFE. Such fillings have the advantage that they can adapt the coefficient of thermal expansion of the adhesive layer to the coefficient of thermal expansion of the semiconductor material.

In order to ensure access to the electrodes of the semiconductor chips of the semiconductor module, the leads have surface-mountable external contact areas. For this purpose, the external contact areas can be surfaces of coatings composed of solderable materials. This additionally has the advantage that the semiconductor module with these surface-mountable external contact areas can be fixed onto corresponding "footprints" of a superordinate circuit board.

Finally, the semiconductor module has a plastic housing, in the plastic housing composition of which are embedded the semiconductor chip, the control chip, connecting elements and internal sections of the leads and also the chip island, wherein external sections of the leads continue to be kept free of plastic housing composition. In this case, that a semiconductor module of this type has a thickness as is standardized for standard component housings, and no special productions are required for, for example, injection-moulding housings of stacked semiconductor chips.

A method for producing semiconductor modules each having at least one semiconductor chip and a control chip at different supply potentials has the following method processes. The first process involves producing semiconductor chips having a supply electrode on their rear sides and electrodes on their top sides. This is followed by providing control chips having supply electrodes and signal input and control signal output electrodes on their top sides. Finally, a leadframe is provided, which has semiconductor module positions which, for their part, have leads with internal and external sections, wherein the leads surround a lead chip island.

Once these three components have been produced or provided, in the semiconductor chip positions semiconductor chips are in each case applied to an electrically conductive partial region of the chip island. This is followed by selectively applying an insulation layer to a further partial region of the lead chip island and/or to the rear sides of the control chips. Finally, the control chips are applied to the insulating partial region of the chip island or to the partial region reserved for the control chips, in each of the semiconductor module positions. This is followed by fitting connecting elements between the leads and the electrodes of the semiconductor chips and also between the electrodes of the semiconductor chips among one another.

A method of this type has the advantage that a plurality of semiconductor modules can be produced in parallel on a leadframe. For this purpose, it is merely necessary for the subsequent method processes also to be carried out after applying connecting elements. These include embedding the semiconductor chips, the connecting elements and the internal sections of the leads of the leadframe into a plastic housing composition whilst leaving free external sections of the leads. The leadframe can then be separated into individual semiconductor modules.

A power semiconductor chip is used as the semiconductor chip and diffusion solder layers composed of a diffusion solder material are applied to the power supply electrode of the power semiconductor chip. Diffusion solder layers have substances from the group AuSn, AgSn, CuSn and/or InAg and form intermetallic phases during the diffusion soldering, wherein the melting point of such intermetallic phases is higher than a diffusion soldering temperature.

For the diffusion soldering, the semiconductor chip and the supply lead are heated to a diffusion soldering temperature $T_D$ of between $180°\,C.\leq T_D \leq 450°\,C$. In the semiconductor module positions of a leadframe, for this purpose it is possible to apply a MOSFET having a vertical drift path and a vertical trench gate structure and also having a source electrode on its top side and a drain electrode on its rear side, wherein the drain electrode is diffusion-soldered onto the supply lead. The other power output electrode on the top side can then be connected either via a connecting element to a power output lead via a connecting link or a plurality of bonding tapes or a plurality of thick aluminium bonding wires. A contact pressure is exerted during the diffusion soldering in order to ensure contact-making during the heating to diffusion solder temperature. Instead of soldering, however, it is also possible to effect adhesive bonding with the aid of a conductive adhesive. For the control chip, by contrast, provision is made for fixing it on the chip island by an insulating adhesive.

Planar copper plates can be structured for producing leadframes by using a planar metal plate being stamped or subjected to wet or dry etching.

Instead of a structuring of a metal plate, it is also possible to produce the leadframe by electrodepositing the leadframe structure on an auxiliary carrier and then removing the auxiliary carrier from the leadframe produced.

For packaging the semiconductor modules including at least one semiconductor chip and a control chip and also the connecting elements, these are embedded into a plastic housing composition by injection-moulding technology while leaving free external contact areas of the leads on the underside of the semiconductor module.

Finally, the separation of the leadframe into individual semiconductor modules can be effected by a laser separating technique, by an etching method or by a sawing or stamping method.

FIG. 1 illustrates a schematic cross section through a semiconductor module 1 of a first embodiment of the invention. The semiconductor module 1 has a semiconductor device in a plastic housing 38 composed of a plastic housing composition 39, the semiconductor device having as circuit carrier leads 37 and a lead chip island 9. While the lead chip island 9 is embedded within the plastic housing composition 39, the leads 37 project on the right-hand side of FIG. 1 with a power lead 31 and on the left-hand side of FIG. 1 with a supply lead 29 in the form of external sections 43 of the leads 37.

Surface-mountable external contact areas 36 including a solderable coating are arranged on the undersides of the external sections 43 of the leads. The internal sections 42 of the leads 37 are surrounded by the plastic housing composition 39 and have on their top sides contact pads 44, on which are fixed a connecting element in the form of a connecting link 32 and a connecting element in the form of a bonding wire 28.

Arranged on the lead chip island 9 are a semiconductor chip 3 having power electrodes 5 and 8 and a control chip 4 having an integrated circuit, which control chip is electrically connected via a bonding wire 28 to a control electrode 6 on the top side 7 of the semiconductor chip 3. While a power supply electrode 14 as rear side electrode 8 on the rear side 13 of the semiconductor chip 3 is connected to an electrically conductive partial region 10 via a diffusion solder layer 34, the control chip 4 is arranged with its rear side 40 on an insulation layer 11, which constitutes an insulating adhesive layer 35 and ensures a dielectric strength of greater than 100 volts relative to the potential of the lead chip island 9.

Consequently, two semiconductor chips 3 and 4 for differential potentials are arranged on the lead chip island 9 without it being necessary to provide separate semiconductor chip islands for the semiconductor module 1. While the rear side electrode 8 of the power semiconductor chip 3 serves as power supply electrode 14, the power electrode 5 on the top side 7 of the power semiconductor chip 3 forms a power output electrode 15, which is connected via the connecting link 32, which is also called a "CLIP" and has a cross section suitable for high currents, to the power lead 31 via the contact pad 44.

The control chip 4 can have a plurality of signal electrodes 20 and/or supply electrodes 18 on its top side 17, while the power semiconductor chip 3 of this embodiment of the semiconductor module has only one control electrode 6 in the form of a gate electrode.

When a supply voltage is applied to the supply lead 29, via the contact pad 44 of the internal section 42 of the supply lead 29, the control chip 4 is supplied with a voltage via the supply electrode 18 and can pass a switching signal via the signal electrode 20 and the bonding wire connection 28 to the control electrode 6 on the top side 7 of the power semiconductor chip 3, such that the power semiconductor chip 3 turns on a vertical current path, whereupon a forward current flows between the rear side electrode 8, operating as power supply electrode 14, to the power output electrode 15 on the top side 7 of the semiconductor chip. The forward current is passed on via the connecting link 32 and the contact pad 44 of the internal section 42 of the power lead 31 to the surface-mountable external contact area 36. Consequently, in this embodiment of the invention, the control chip 4 serves as a gate driver for the power semiconductor chip 3 and is arranged with the power semiconductor chip 3 on a common lead island 9 despite different supply potentials.

FIG. 2 illustrates a schematic cross section through a semiconductor module 2 of a second embodiment of the invention. Components having the same functions as in FIG. 1 are identified by the same reference symbols and are not discussed separately. The contour of the plastic housing, as is additionally illustrated by using a dash-dotted line in FIG. 1, has been omitted here. Moreover, this second embodiment of the invention illustrates that it is possible not just to arrange a control chip 4 on the semiconductor chip island 9 on an insulation layer 11, rather that a further signal-processing semiconductor chip 33 can also be arranged on the lead chip island 9 by its rear side 41 by using a further insulation layer 12. In this case, the lead chip island 9 is at a drain potential of a MOSFET semiconductor chip 3, which is electrically connected via its rear side contact 8 via a solder connection 34 to the electrically conductive partial region 10 of the lead chip island 9. The further arrangement of leads and connecting elements is illustrated in FIG. 3.

FIG. 3 illustrates a schematic plan view of the semiconductor module 2 in accordance with FIG. 2. This semiconductor module 2 has supply leads 29 and 30 for each of the signal-processing semiconductor chips 4 and 33, respectively, the supply leads being connected to the supply electrodes 19 on the top side 17 of the signal-processing semiconductor chips 4 and 33, while the second supply electrode 18 is in each case connected to the drain potential of the power semiconductor chip 3 via a bonding wire 28. The further signal leads 24 to 27 are electrically connected via bonding wires 28 to the signal electrodes 20 to 23 on the top sides 17 of the signal-processing semiconductor chips 4 and 33.

In this case, the supply leads 30 and 29 and also the signal leads 24 to 27 for the two signal-processing semiconductor chips 4 and 33 are led out from the plastic housing 38, the contour of which is identified by a dash-dotted line, on opposite sides of the semiconductor module 2. The signal-processing semiconductor chips 4 and 33 are also electrically connected via bonding wire connections 28 to the control electrode 6 of the power semiconductor chip 3. The control electrode 6 is connected via a further connecting line to a gate lead G on the upper edge of the housing 28. Furthermore, the power outputs $S_1$ to $S_4$ are connected to the power leads 31 via bonding tape connections 32, while the electrically conductive partial region 10 of the lead chip island 9, on which the drain electrode of the power semiconductor chip 3 is arranged, is led out from the plastic housing with five leads $D_1$ to $D_5$.

As illustrated by the plan view of this semiconductor module 2, it would also be possible to position yet another power semiconductor chip on this standard lead chip island 9 in the region of the bottom left corner of the lead chip island 9. A line A-A identified by double dot and dashes illustrates the profile of the sectional plane for the cross section illustrated in FIG. 2. The non-transparent plastic housing composition has been omitted both in FIG. 2 and in FIG. 3 in order to illustrate the arrangement of the semiconductor chips 3, 4 and 33 in an electrically conductive partial region 10 and in an insulated partial region of the lead chip island 9.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit device, comprising:
   a semiconductor chip including a rear side having a rear side electrode being a large-area power supply electrode for applying a supply potential, and a top side having a small-area control electrode and a large-area power output electrode;
   a plurality of power outputs;
   a plurality of first connecting elements each having a first cross section and having a first end connected to the large-area power output electrode on the top side of the semiconductor chip and a second end connected to a corresponding one of the power outlets for translating an output current to the power outputs;
   a second connecting element having a second cross section smaller than the first cross section and having a first end connected to the small-are control electrode and a second end connected to a gate lead;
   a control chip, wherein the semiconductor chip and the control chip are at different supply potentials; and
   a lead chip island including a surface that has an electrically conductive partial region and an insulation layer situated on a second region of the lead chip island surface, the insulation layer including one of the following substances: epoxy resin, acrylic resin, silicone resin, polyimide, high-performance thermoplastics or mixtures thereof or a plastic film composed of the substances, and wherein the substances of the insulation adhesive layer are filled with insulating particles from the group $SiO_2$, BN, $Al_2O_3$, AlN, diamond or PTFE;
   wherein the semiconductor chip is arranged with the rear side electrode directly electrically connected to the electrically conductive partial region of the lead chip island and the control chip is cohesively fixed on the insulation layer.

2. The integrated circuit device of claim 1, wherein the control chip includes a top side having supply electrodes and input signal and/or control signal electrodes, wherein the control chip is operatively connected to a control electrode of the semiconductor chip.

3. The integrated circuit device of claim 1, further comprising signal leads electrically connected via connecting elements to input signal and/or control signal electrodes of the control chip and/or of the semiconductor chip.

4. The integrated circuit device of claim 2, further comprising supply leads electrically connected via connecting elements to the supply electrodes on the top side of the control chip.

5. The integrated circuit device of claim 1, further comprising bonding wires or bonding tapes as connecting elements for signal, control and supply electrodes of the control chip and of the semiconductor chips among one another or to corresponding leads.

6. The integrated circuit device of claim 1, wherein the conducting elements are clips.

7. The integrated circuit device of claim 1, wherein the chip island includes a copper alloy.

8. The integrated circuit device of claim 1, wherein the chip island is electrically connected to a power lead.

9. The integrated circuit device of claim 1, further comprising a supply lead for an earth potential, on which a MOSFET is arranged by its drain electrode or an IGBT is arranged by its collector electrode.

10. The integrated circuit device of claim 1, further comprising a signal-processing chip on the insulation area of the chip island, the signal-processing semiconductor chip functioning as a gate driver.

11. The integrated circuit device of claim 1, wherein a diffusion solder layer is arranged between the rear side electrode of the semiconductor chip and the chip island.

12. The integrated circuit device of claim 11, wherein the diffusion solder layer includes an intermetallic phase from the group AuSn, AgSn, CuSn or AgIn.

13. The integrated circuit device of claim 1, further comprising surface-mountable external contact areas.

14. The integrated circuit device of claim 1, wherein first ends the power outlets and a first end of the gate lead are embedded in a plastic housing, and wherein second ends of the power outlets and a second end of the gate lead extend from the plastic housing.

15. A method for producing an integrated circuit device, comprising:
providing a semiconductor chip having electrodes including a rear side electrode being a large-area power supply electrode for applying a supply potential, and a top side having a small-area control electrode and a large-area power output electrode;
providing a control chip having electrodes, the semiconductor chip and the control chip being at different potentials;
attaching the rear side electrode of the semiconductor chip to an electrically conductive partial first region of a surface of a chip island;
selectively applying an insulation layer to a partial second region of the surface of the chip island and/or to the rear sides of the control chip, wherein the insulation layer includes one of the following substances: epoxy resin, acrylic resin, silicone resin, polyimide, high-performance thermoplastics or mixtures thereof or a plastic film composed of the substances, and wherein the substances of the insulation adhesive layer are filled with insulating particles from the group $SiO_2$, BN, $Al_2O_3$, AlN, diamond or PTFE;
situating the control chip on the surface of the chip island such that the insulation layer is situated between the surface of the chip island and the control chip;
providing a plurality of first connecting elements each having a first cross section and having a first end;
connecting the first ends to the large-area power output electrode on the top side of the semiconductor chip and connecting the second ends connected to corresponding leads, the leads surrounding the chip island and each having a first end spaced apart from the chip island;
providing a second connecting element having a second cross section smaller than the first cross section;
connecting a first end of the second connecting element to the small are control electrode and connecting a second end of the second electrode to a gate lead; and
connecting selected electrodes of the semiconductor chip and the control chip to one another with connecting elements.

16. The method of claim 15, further comprising embedding the semiconductor chip, the control chip, the connecting elements, the chip island and the first ends of the leads in a plastic housing composition, wherein second ends of the leads extend from the plastic housing composition.

17. The method of claim 15, wherein diffusion solder layers are applied to selected electrodes of the semiconductor chip, the diffusion solder layers being composed of a diffusion solder material which include at least one of the substances AuSn, AgSn, CuSn and/or InAg and form intermetallic phases during a diffusion soldering whose melting points are higher than a diffusion soldering temperature.

18. The method of claim 17, comprising wherein a diffusion soldering temperature $T_D$ of between $180°$ C.$\leq T_D \leq 450°$ C. is used during the diffusion soldering.

19. The method of claim 15, wherein the control chip is adhesively bonded onto the chip island by using an insulating adhesive.

20. The integrated circuit device of claim 1, wherein the insulation layer does not extend below the rear side electrode.

* * * * *